United States Patent
Powell et al.

(10) Patent No.: US 12,012,089 B2
(45) Date of Patent: Jun. 18, 2024

(54) AUXILIARY DEVICE POWER TESTING FOR VEHICLE POWER DELIVERY

(71) Applicant: Ford Global Technologies, LLC, Dearborn, MI (US)

(72) Inventors: Stephen Thomas Powell, Auburn Hills, MI (US); Samuel Johnson, Garden City, MI (US); Thomas Kostrzewski, Brownstown, MI (US); Ling Gong, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 373 days.

(21) Appl. No.: 17/483,463

(22) Filed: Sep. 23, 2021

(65) Prior Publication Data
US 2023/0093349 A1 Mar. 23, 2023

(51) Int. Cl.
*B60W 20/10* (2016.01)
*G01R 31/367* (2019.01)

(52) U.S. Cl.
CPC ............ *B60W 20/10* (2013.01); *G01R 31/367* (2019.01)

(58) Field of Classification Search
CPC .............................. B60W 20/10; G01R 31/367
USPC .......................................................... 701/22
See application file for complete search history.

(56) References Cited

U.S. PATENT DOCUMENTS

| | | | | |
|---|---|---|---|---|
| 9,705,319 | B2 * | 7/2017 | Morita | H02J 1/06 |
| 10,884,475 | B1 * | 1/2021 | Wang | G06F 1/3296 |
| 2004/0041538 | A1 * | 3/2004 | Sklovsky | H04W 52/0264 |
| | | | | 320/127 |
| 2004/0051500 | A1 * | 3/2004 | Kuroda | H02J 7/14 |
| | | | | 320/104 |
| 2006/0119365 | A1 * | 6/2006 | Makhija | G01R 31/007 |
| | | | | 324/380 |

(Continued)

FOREIGN PATENT DOCUMENTS

| | | |
|---|---|---|
| CN | 101546352 A | 9/2009 |
| CN | 108152742 A | 6/2018 |

(Continued)

OTHER PUBLICATIONS

Randal Beattie, "Hybrid and Electric Vehicle Powertrain Testing Methods for Maximum Efficiency", Electric & Hybrid Vehicle Technology International, Oct. 16, 2020, six pages.

*Primary Examiner* — Richard A Goldman
(74) *Attorney, Agent, or Firm* — Frank Lollo; Eversheds Sutherland (US) LLP (57) ABSTRACT

A vehicle power testing system is described. The power testing system may provide power testing that displays maximum simultaneous power usage for multiple auxiliary devices drawing power from the vehicle power generation system over a span of time. The power testing system may initialize a power test using a simple user interface, determine a number of auxiliary devices predicted to be connected to the power generation system at a future time, and generate a power simulation profile for the multiple connected auxiliary devices. The power testing system may generate an indication of maximum aggregate power usage and an alert message indicating that multiple auxiliary devices may be simultaneously used while connected to the vehicle power generation system based on an aggregate power rating associated with the vehicle power generation system.

18 Claims, 6 Drawing Sheets

(56) References Cited

U.S. PATENT DOCUMENTS

| | | | |
|---|---|---|---|
| 2008/0211230 A1* | 9/2008 | Gurin | B60W 10/30 |
| | | | 290/2 |
| 2008/0252148 A1* | 10/2008 | Pursifull | B60R 16/03 |
| | | | 307/81 |
| 2009/0174365 A1* | 7/2009 | Lowenthal | B60L 53/68 |
| | | | 705/13 |
| 2012/0288777 A1* | 11/2012 | Kazuno | H01M 8/04753 |
| | | | 429/432 |
| 2012/0296505 A1* | 11/2012 | Igarashi | H01M 8/04947 |
| | | | 701/22 |
| 2012/0330505 A1* | 12/2012 | Tsumori | B60W 30/18127 |
| | | | 701/36 |
| 2013/0063072 A1* | 3/2013 | Shirasaka | H01M 8/04753 |
| | | | 320/101 |
| 2013/0096745 A1 | 4/2013 | Hussain et al. | |
| 2013/0124077 A1* | 5/2013 | Kim | B60W 40/13 |
| | | | 701/123 |
| 2013/0127475 A1* | 5/2013 | Sitarski | B60L 58/20 |
| | | | 324/435 |
| 2013/0264867 A1* | 10/2013 | Mitsutani | B60L 1/00 |
| | | | 307/10.1 |
| 2015/0323979 A1* | 11/2015 | Kaestner | G06F 1/28 |
| | | | 713/323 |
| 2017/0010125 A1* | 1/2017 | Adachi | G01C 21/3469 |
| 2017/0028868 A1* | 2/2017 | Minamiura | B60W 20/13 |
| 2019/0081503 A1* | 3/2019 | Kim | H04L 12/2834 |
| 2019/0354362 A1* | 11/2019 | Saito | B60Q 9/00 |
| 2020/0317057 A1* | 10/2020 | Salter | B60K 6/26 |
| 2021/0091568 A1* | 3/2021 | Salerno | H02J 13/00002 |
| 2021/0170884 A1* | 6/2021 | Sakakibara | B60L 50/60 |
| 2021/0277971 A1* | 9/2021 | Marmara | F16D 66/026 |
| 2022/0088999 A1* | 3/2022 | Hoshino | B60H 1/3208 |
| 2022/0169134 A1* | 6/2022 | Xu | B60L 3/0015 |
| 2022/0334158 A1* | 10/2022 | Foreman | H04Q 9/00 |
| 2023/0060085 A1* | 2/2023 | Folick | B60L 58/40 |
| 2023/0093349 A1* | 3/2023 | Powell | G01R 31/367 |
| | | | 701/22 |
| 2023/0147014 A1* | 5/2023 | Gottlieb | H01H 85/0241 |
| | | | 429/7 |
| 2023/0154418 A1* | 5/2023 | Kunkel | G09G 3/2092 |
| | | | 345/212 |
| 2023/0241758 A1* | 8/2023 | Chu | G01S 17/08 |
| | | | 356/4.01 |
| 2023/0306156 A1* | 9/2023 | Rydström | G06F 30/15 |
| | | | 703/8 |

FOREIGN PATENT DOCUMENTS

| | | |
|---|---|---|
| CN | 109733470 A | 5/2019 |
| WO | 2009094367 A1 | 7/2009 |

* cited by examiner

AUXILIARY DEVICE POWER TESTING FOR VEHICLE POWER DELIVERY

BACKGROUND

Current electric vehicles and hybrid electric vehicles are capable of powering auxiliary devices that are not part of the vehicle system. Customers using their electric vehicle to power multiple auxiliary devices may not be able to easily view the maximum power draw when multiple devices are powered by the vehicle power generator or batteries. This may result in overloading the vehicle power system, which may cause the protective power circuits onboard the vehicle to trip or become overworked.

Using current methods, electric vehicle users that power multiple devices simultaneously may walk back and forth between the device(s) and the vehicle to determine if the power draw exceeds the maximum threshold for which the vehicle is rated. This can be cumbersome and an annoyance for the user, and the user may remain unsure if the power generation is working properly or is being harmed by the heavy use. In other aspects, using conventional vehicle power generation systems, users may not have a way to view historical power loads.

It is with respect to these and other considerations that the disclosure made herein is presented.

BRIEF DESCRIPTION OF THE DRAWINGS

The detailed description is set forth with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale. Throughout this disclosure, depending on the context, singular and plural terminology may be used interchangeably.

DETAILED DESCRIPTION

Overview

The present disclosure relates to electric vehicle power generation and delivery systems. More particularly, the present disclosure is directed to auxiliary device power testing for vehicle power delivery systems. For example, a vehicle power testing system for a vehicle power generation system is described, which includes systems and methods that are configured and/or programmed to provide power testing for auxiliary devices that may be connectable to the vehicle power generation system.

The vehicle power generation test system displays maximum simultaneous power usage for multiple auxiliary devices drawing power from the vehicle power generation system over a span of time. The power testing system may initialize a power test using a simple user interface, determine a number of auxiliary devices predicted to be connected to the power generation system at a future time, and generate a power simulation profile for the multiple connected auxiliary devices. The power testing system may generate an indication of maximum aggregate power usage and an alert message indicating that multiple auxiliary devices may be simultaneously used while connected to the vehicle power generation system based on an aggregate power rating associated with the vehicle power generation system.

The test mode feature may be updatable to vehicles having power generation capabilities. The test mode feature may provide an auxiliary device power testing for vehicle power delivery systems easily and quickly. The power test system may indicate that multiple auxiliary devices may be simultaneously used while connected to the vehicle power generation system. The power test system may further indicate an aggregate power rating associated with the vehicle power generation system and individual or cumulative auxiliary devices that may be powered by the vehicle generator/battery system.

The vehicle power test system may increase user satisfaction for electric vehicle users by providing an intuitive and comprehensive way to test whether a particular set of auxiliary devices may be used simultaneously while drawing power from the vehicle power generation and distribution system. The vehicle power test system may eliminate the need for tedious testing of each device independently and recording the individual power generation requirements needed to power the device for manually determining a theoretical aggregate power requirement. The disclosed system and methods may be readily implemented on a vehicle CAN, working in an integrated way with existing CAN signals without the need for additional hardware for implementation. These and other advantages of the present disclosure are provided in greater detail herein.

Illustrative Embodiments

The disclosure will be described more fully hereinafter with reference to the accompanying drawings, in which example embodiments of the disclosure are shown, and not intended to be limiting.

Figure 1:
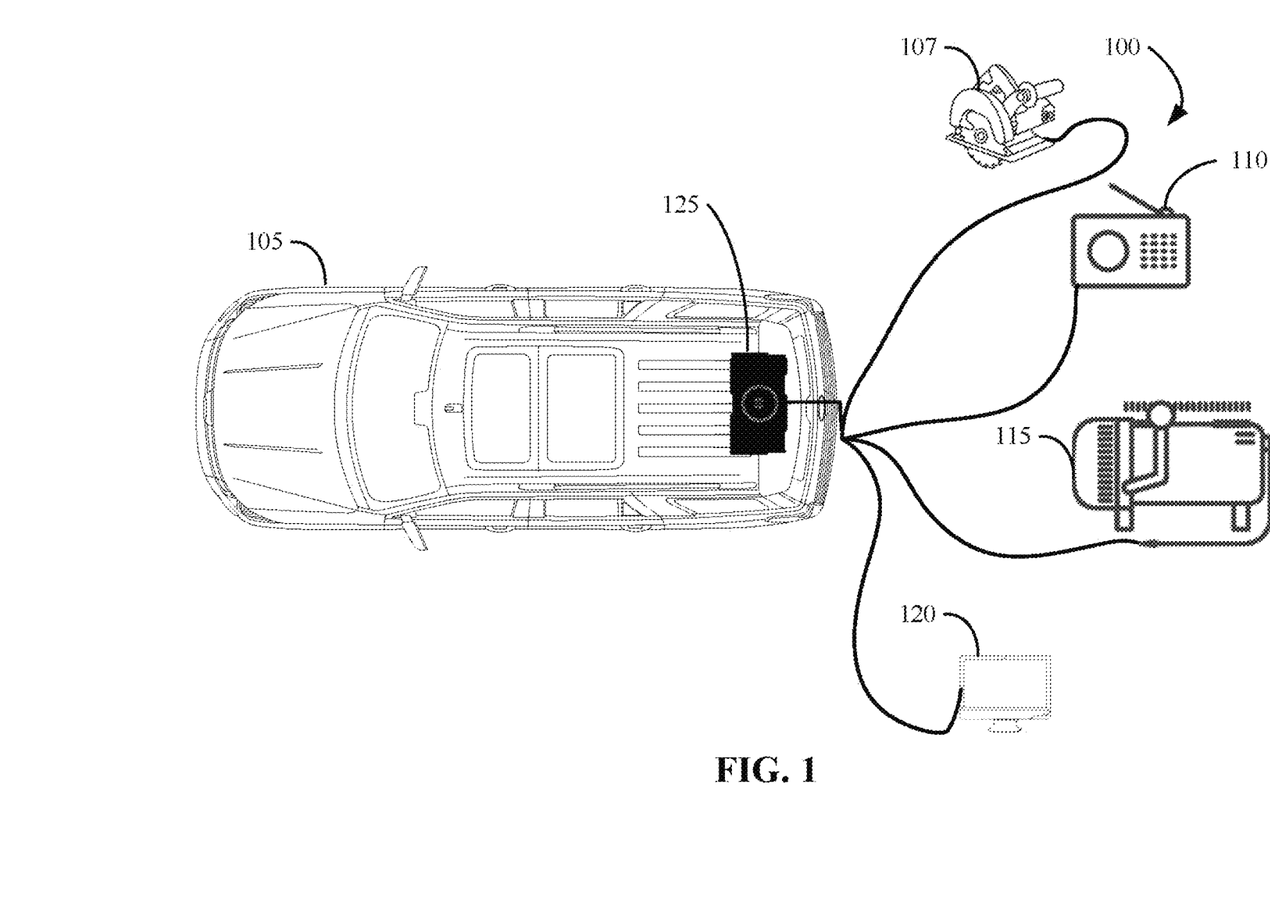
FIG. 1 illustrates a conventional device powering scenario where a vehicle power delivery system provides power for multiple auxiliary devices, in accordance with the present disclosure.

FIG. 1 illustrates a conventional auxiliary device powering example, in accordance with the present disclosure. The connected power distribution system of FIG. 100 includes an electric vehicle 105 having a power generation and delivery system 125 that generates power for vehicle 105 use, and generates sufficient additional power to actuate (possibly) one or more auxiliary devices 100. For users of electric powertrain vehicles such as the example vehicle 105, the power generation features of many vehicles make them an attractive option for convenience and utility to power their auxiliary devices 100. For example, the auxiliary devices 100 can include one or more portable electric devices such as power tools 107, portable electronics such as the radio 110, power tool actuation devices such as the compressor 115, and/or home electronics or other devices 120. Users may not be sure how much power is used by respective devices of the auxiliary devices 100. As each one is connected to the vehicle and used, they may need to monitor not only the functionality of the device itself, individually, to ensure that it operates properly, but they may need to monitor ammeters and other measurement tools integrated with the power distribution system to ensure that the total (aggregate) power consumption does not exceed the rated power draw for the vehicle 105. As used herein, auxiliary devices are any electrically actuated device that is not part of an electric vehicle (such as an electric vehicle similar to the vehicle 105).

It may be advantageous, therefore, to provide a testing system that may initialize a power test using a simple user interface, determine a number of auxiliary devices (such as the plurality of auxiliary devices 100), that are predicted to be connected to the power generation system 125 at a future time. It may also be advantageous to generate a power simulation profile for the multiple connected auxiliary devices 100. The power testing system may generate an indication of maximum aggregate power usage and an alert message indicating that multiple auxiliary devices may be simultaneously used while connected to the vehicle power generation system based on an aggregate power rating associated with the vehicle power generation system.

Figure 2:
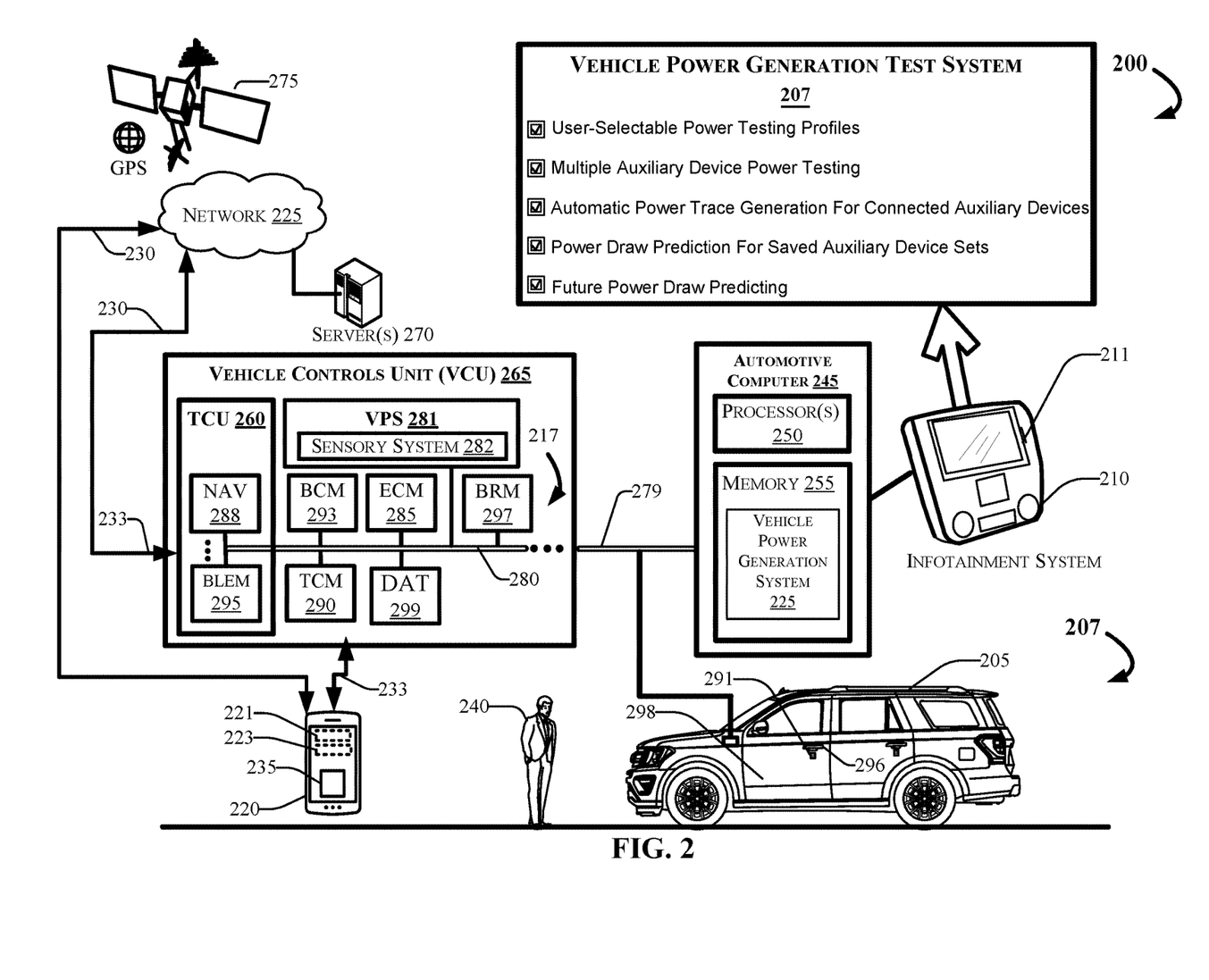
FIG. 2 depicts an example computing environment in which techniques and structures for providing the systems and methods disclosed herein may be implemented.

FIG. 2 depicts an example computing environment 200 that can include a vehicle 205, which may be substantially similar to or identical to the example vehicle 105 as shown in FIG. 1. The vehicle 205 may include an automotive computer 245, and a Vehicle Controls Unit (VCU) 265 that can include a plurality of electronic control units (ECUs) 217 disposed in communication with the automotive computer 245. A mobile device 220, which may be associated with a user 240 and the vehicle 205, may connect with the automotive computer 245 using wired and/or wireless communication protocols and transceivers. The mobile device 220 may be communicatively coupled with the vehicle 205 via one or more network(s) 225, which may communicate via one or more wireless connection(s) 230, and/or may connect with the vehicle 205 directly using near field communication (NFC) protocols, Bluetooth® protocols, Wi-Fi, Ultra-Wide Band (UWB), and other possible data connection and sharing techniques.

The vehicle 205 may also receive and/or be in communication with a Global Positioning System (GPS) 275. The GPS 275 may be a satellite system (as depicted in FIG. 2) such as the global navigation satellite system (GLNSS), Galileo, or navigation or other similar system. In other aspects, the GPS 275 may be a terrestrial-based navigation network. In some embodiments, the vehicle 205 may utilize a combination of GPS and Dead Reckoning responsive to determining that a threshold number of satellites are not recognized.

The automotive computer 245 may be or include an electronic vehicle controller, having one or more processor(s) 250 and memory 255. The automotive computer 245 may, in some example embodiments, be disposed in communication with the mobile device 220, and one or more server(s) 270. The server(s) 270 may be part of a cloud-based computing infrastructure, and may be associated with and/or include a Telematics Service Delivery Network (SDN) that provides digital data services to the vehicle 205 and other vehicles (not shown in FIG. 2) that may be part of a vehicle fleet.

Although illustrated as a sport utility, the vehicle 205 may take the form of another passenger or commercial automobile such as, for example, a car, a truck, a crossover vehicle, a van, a minivan, a taxi, a bus, etc., and may be configured and/or programmed to include various types of automotive drive systems. Example drive systems can include various types of internal combustion engines (ICEs) powertrains having a gasoline, diesel, or natural gas-powered combustion engine with conventional drive components such as, a transmission, a drive shaft, a differential, etc., and include a power generation and distribution system similar to the system 125 as shown in FIG. 1. In another configuration, the vehicle 205 may be configured as an electrified vehicle (EV). More particularly, the vehicle 205 may include a battery EV (BEV) drive system, or be configured as a hybrid EV (HEV) having an independent onboard powerplant, a plug-in HEV (PHEV) that includes a HEV powertrain connectable to an external power source, and/or includes a parallel, series, or power split hybrid powertrain having a combustion engine powerplant and one or more EV drive systems. HEVs may further include battery and/or supercapacitor banks for power storage, flywheel power storage systems, or other power generation and storage infrastructure. The vehicle 205 may be further configured as a fuel cell vehicle (FCV) that converts fuel to usable power using a fuel cell, (e.g., a hydrogen fuel cell vehicle (HFCV) powertrain, etc.) and/or any combination of these drive systems and components.

Further, the vehicle 205 may be a manually driven vehicle, and/or be configured and/or programmed to operate in a fully autonomous (e.g., driverless) mode (e.g., Level-5 autonomy) or in one or more partial autonomy modes which may include driver assist technologies. Examples of partial autonomy (or driver assist) modes are widely understood in the art as autonomy Levels 1 through 4.

A vehicle having a Level-0 autonomous automation may not include autonomous driving features. Accordingly, the vehicle power generation test system 207 may provide some aspects of human control to the vehicle 205, when the vehicle is configured as an autonomous vehicle (AV).

Figure 5:
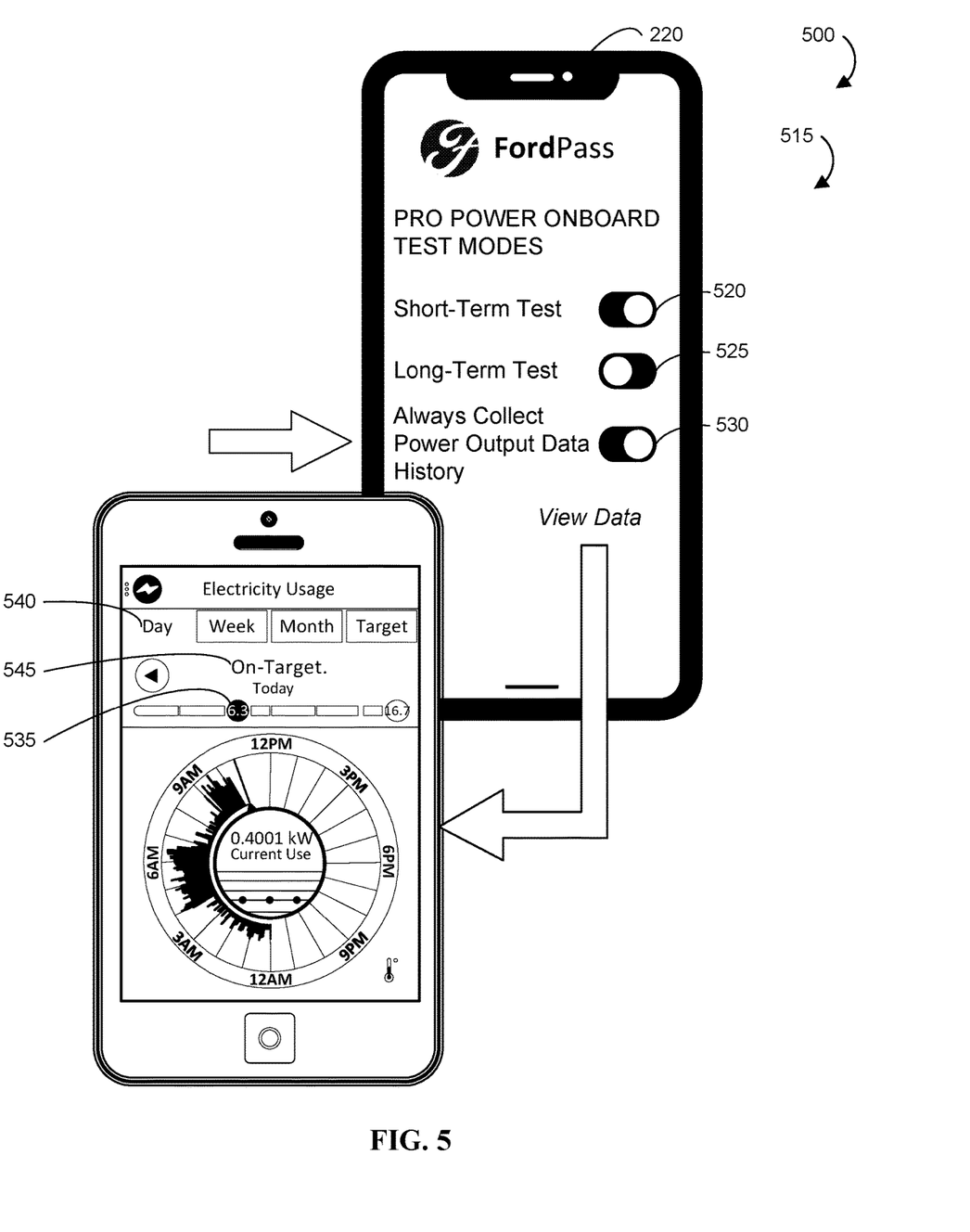
FIG. 5 depicts example user interfaces for auxiliary device power testing in accordance with the present disclosure.

The mobile device 220 can include a memory 223 for storing program instructions associated with an application 235 that, when executed by a mobile device processor 221, performs aspects of the disclosed embodiments. The application (or "app") 235 may be part of the vehicle power generation test system 207, or may provide information to the vehicle power generation test system 207 and/or receive information from the vehicle power generation test system 207. For example, FIG. 5 illustrates several user interfaces that provide examples of various ways the system 207 may produce output and receive input from users (e.g., the user 204) using the system 207.

In some aspects, the mobile device 220 may communicate with the vehicle 205 through the one or more wireless connection(s) 230, which may be encrypted and established between the mobile device 220 and a Telematics Control Unit (TCU) 260. The mobile device 220 may communicate with the TCU 260 using a wireless transmitter (not shown in FIG. 2) associated with the TCU 260 on the vehicle 205. The transmitter may communicate with the mobile device 220 using a wireless communication network such as, for example, the one or more network(s) 225. The wireless connection(s) 230 are depicted in FIG. 2 as communicating via the one or more network(s) 225, and via one or more wireless connection(s) 233 that can be direct connection(s) between the vehicle 205 and the mobile device 220. The wireless connection(s) 233 may include various low-energy protocols including, for example, Bluetooth®, Bluetooth® Low-Energy (BLE®), UWB, Near Field Communication (NFC), or other protocols.

The network(s) 225 illustrate an example communication infrastructure in which the connected devices discussed in various embodiments of this disclosure may communicate. The network(s) 225 may be and/or include the Internet, a private network, public network or other configuration that operates using any one or more known communication protocols such as, for example, transmission control protocol/Internet protocol (TCP/IP), Bluetooth®, BLE®, Wi-Fi based on the Institute of Electrical and Electronics Engineers (IEEE) standard 802.11, UWB, and cellular technologies such as Time Division Multiple Access (TDMA), Code Division Multiple Access (CDMA), High Speed Packet Access (HSPDA), Long-Term Evolution (LTE), Global System for Mobile Communications (GSM), and Fifth Generation (5G), to name a few examples.

The automotive computer 245 may be installed in an engine compartment of the vehicle 205 (or elsewhere in the vehicle 205) and operate as a functional part of the vehicle power generation test system 207, in accordance with the disclosure. The automotive computer 245 may include one or more processor(s) 250 and a computer-readable memory 255.

The one or more processor(s) 250 may be disposed in communication with one or more memory devices disposed in communication with the respective computing systems (e.g., the memory 255 and/or one or more external databases not shown in FIG. 2). The processor(s) 250 may utilize the memory 255 to store programs in code and/or to store data for performing aspects in accordance with the disclosure. The memory 255 may be a non-transitory computer-readable memory storing a vehicle power generation test program code. The memory 255 can include any one or a combination of volatile memory elements (e.g., dynamic random access memory (DRAM), synchronous dynamic random-access memory (SDRAM), etc.) and can include any one or more nonvolatile memory elements (e.g., erasable programmable read-only memory (EPROM), flash memory, electronically erasable programmable read-only memory (EEPROM), programmable read-only memory (PROM), etc.

The VCU 265 may share a power bus 278 with the automotive computer 245, and may be configured and/or programmed to coordinate the data between vehicle 205 systems, connected servers (e.g., the server(s) 270), and other vehicles (not shown in FIG. 2) operating as part of a vehicle fleet. The VCU 265 can include or communicate with any combination of the ECUs 217, such as, for example, a Body Control Module (BCM) 293, an Engine Control Module (ECM) 285, a Transmission Control Module (TCM) 290, the TCU 260, a Driver Assistances Technologies (DAT) controller 299, etc. The VCU 265 may further include and/or communicate with a Vehicle Perception System (VPS) 281, having connectivity with and/or control of one or more vehicle sensory system(s) 282. In some aspects, the VCU 265 may control operational aspects of the vehicle 205, and implement one or more instruction sets received from the application 235 operating on the mobile device 220, from one or more instruction sets stored in computer memory 255 of the automotive computer 245, including instructions operational as part of the vehicle power generation test system 207.

The TCU 260 can be configured and/or programmed to provide vehicle connectivity to wireless computing systems onboard and offboard the vehicle 205, and may include a Navigation (NAV) receiver 288 for receiving and processing a GPS signal from the GPS 275, a BLE® Module (BLEM) 295, a Wi-Fi transceiver, a UWB transceiver, and/or other wireless transceivers (not shown in FIG. 2) that may be configurable for wireless communication between the vehicle 205 and other systems, computers, and modules. The TCU 260 may be disposed in communication with the ECUs 217 by way of a bus 280. In some aspects, the TCU 260 may retrieve data and send data as a node in a CAN bus.

The BLEM 295 may establish wireless communication using Bluetooth® and BLE® communication protocols by broadcasting and/or listening for broadcasts of small advertising packets, and establishing connections with responsive devices that are configured according to embodiments described herein. For example, the BLEM 295 may include Generic Attribute Profile (GATT) device connectivity for client devices that respond to or initiate GATT commands and requests, and connect directly with the mobile device 220.

The bus 280 may be configured as a Controller Area Network (CAN) bus organized with a multi-master serial bus standard for connecting two or more of the ECUs 217 as nodes using a message-based protocol that can be configured and/or programmed to allow the ECUs 217 to communicate with each other. The bus 280 may be or include a high speed CAN (which may have bit speeds up to 1 Mb/s on CAN, 5 Mb/s on CAN Flexible Data Rate (CAN FD)), and can include a low-speed or fault tolerant CAN (up to 125 Kbps), which may, in some configurations, use a linear bus configuration. In some aspects, the ECUs 217 may communicate with a host computer (e.g., the automotive computer 245, the vehicle power generation test system 207, and/or the server(s) 270, etc.), and may also communicate with one another without the necessity of a host computer. The bus 280 may connect the ECUs 217 with the automotive computer 245 such that the automotive computer 245 may retrieve information from, send information to, and otherwise interact with the ECUs 217 to perform steps described according to embodiments of the present disclosure. The bus 280 may connect CAN bus nodes (e.g., the ECUs 217) to each other through a two-wire bus, which may be a twisted pair having a nominal characteristic impedance. The bus 280 may also be accomplished using other communication protocol solutions, such as Media Oriented Systems Transport (MOST) or Ethernet. In other aspects, the bus 280 may be a wireless intra-vehicle bus. According to one or more disclosed embodiments, the system 207 may include the benefit of versatility and ease of installation, at least in part, because it may be integrated with any CAN system such as the CAN bus nodes associated with the ECUs 217. The system 207 may not require additional hardware for implementation of the test protocols described herein.

The VCU 265 may control various loads directly via the bus 280 communication or implement such control in conjunction with the BCM 293. The ECUs 217 described with respect to the VCU 265 are provided for example purposes only, and are not intended to be limiting or exclusive. Control and/or communication with other control modules not shown in FIG. 2 is possible, and such control is contemplated.

In an example embodiment, the ECUs 217 may control aspects of vehicle operation and communication using inputs from human drivers, inputs from an autonomous vehicle controller, the vehicle power generation test system 207, and/or via wireless signal inputs received via the wireless connection(s) 233 from other connected devices such as the mobile device 220, among others. The ECUs 217, when configured as nodes in the bus 280, may each include a central processing unit (CPU), a CAN controller, and/or a transceiver (not shown in FIG. 2). For example, although the mobile device 220 is depicted in FIG. 2 as connecting to the vehicle 205 via the BLEM 295, it is possible and contemplated that the wireless connection 233 may also or alternatively be established between the mobile device 220 and one or more of the ECUs 217 via the respective transceiver(s) associated with the module(s). Moreover, although generally described as part of the DAT 299, it should be appreciated that other architectures are possible and contemplates, such as implementation of the system 207 with the BCM 293 or other controllers of the ECUs 217.

The BCM 293 generally includes integration of sensors, vehicle performance indicators, and variable reactors associated with vehicle systems, and may include processor-based power distribution circuitry that can control functions associated with the vehicle body such as lights, windows, security, door locks and access control, and various comfort controls. The BCM 293 may also operate as a gateway for bus and network interfaces to interact with remote ECUs (not shown in FIG. 2).

The BCM 293 may coordinate any one or more functions from a wide range of vehicle functionality, including energy management systems, alarms, vehicle immobilizers, driver and rider access authorization systems, Phone-as-a-Key (PaaK) systems, driver assistance systems, AV control systems, power windows, doors, actuators, and other functionality, etc. The BCM 293 may be configured for vehicle energy management, exterior lighting control, wiper functionality, power window and door functionality, heating ventilation and air conditioning systems, and driver integration systems. In other aspects, the BCM 293 may control auxiliary equipment functionality, and/or be responsible for integration of such functionality.

Figure 3:
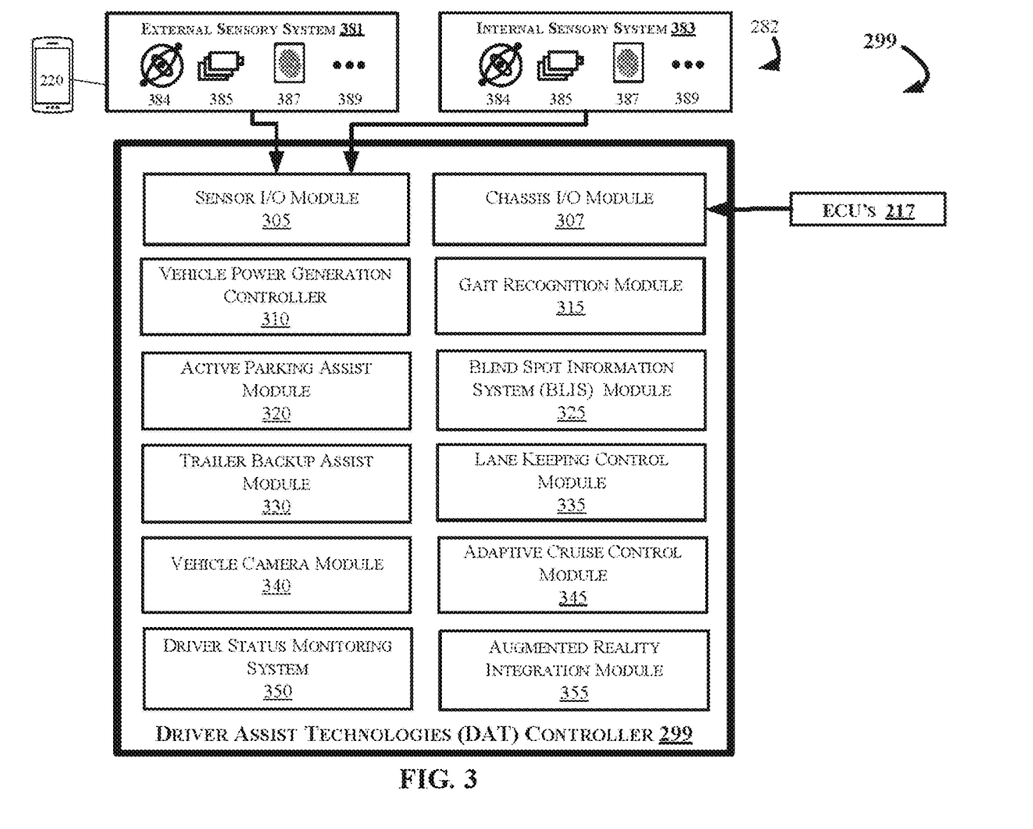
FIG. 3 depicts a functional schematic of a Driver Assist Technologies (DAT) controller in accordance with the present disclosure.

In some aspects, the vehicle 205 may include one or more Door Access Panels (DAPs) 291 disposed on exterior door surface(s) of vehicle door(s) 298, and connected with a DAP controller (not shown in FIG. 3). The DAT controller 299 may provide Level-1 through Level-3 automated driving and driver assistance functionality that can include, for example, active parking assistance, trailer backup assistance, adaptive cruise control, lane keeping, and/or driver status monitoring, among other features. The DAT controller 299 may also provide aspects of user and environmental inputs usable for user authentication.

The DAT controller 299 can obtain input information via the sensory system(s) 282, which may include sensors disposed on the vehicle interior and/or exterior (sensors not shown in FIG. 2). The DAT controller 299 may receive the sensor information associated with driver functions, vehicle functions, and environmental inputs, and other information. The DAT controller 299 may characterize the sensor information for identification of biometric markers stored in a secure biometric data vault (not shown in FIG. 2) onboard the vehicle 205 and/or via the server(s) 270.

In other aspects, the DAT controller 299 may also be configured and/or programmed to control Level-1 and/or Level-2 driver assistance when the vehicle 205 includes Level-1 or Level-2 autonomous vehicle driving features. The DAT controller 299 may connect with and/or include a Vehicle Perception System (VPS) 281, which may include internal and external sensory systems (collectively referred to as sensory systems 281). The sensory systems 282 may be configured and/or programmed to obtain sensor data usable for biometric authentication, and for performing driver assistances operations such as, for example, active parking, trailer backup assistances, adaptive cruise control and lane keeping, driver status monitoring, and/or other features such as the disclosed system 207, for example. The computing system architecture of the automotive computer 245, VCU 265, and/or the vehicle power generation test system 207 may omit certain computing modules. It should be readily understood that the computing environment depicted in FIG. 2 is an example of a possible implementation according to the present disclosure, and thus, it should not be considered limiting or exclusive.

The automotive computer 245 may connect with an infotainment system 210 that may provide an interface for the navigation and GPS receiver 288, and the vehicle power generation test system 207. The infotainment system 210 may include a touchscreen interface portion 211, and may include voice recognition features, biometric identification capabilities that can identify users based on facial recognition, voice recognition, fingerprint identification, or other biological identification means. In other aspects, the infotainment system 210 may provide user identification using mobile device pairing techniques (e.g., connecting with the mobile device 220, a Personal Identification Number (PIN)) code, a password, passphrase, or other identifying means. Accordingly, any one or more of the user interface examples depicted on FIG. 2 may be equally implemented using the infotainment system 210.

FIG. 3 depicts an example DAT controller 299, in accordance with an embodiment. As explained in prior figures, the DAT controller 299 may provide automated driving and driver assistance functionality and may provide aspects of user and environmental assistance. The DAT controller 299 may facilitate user authentication, such as biometric authentication that can include face recognition fingerprint recognition, voice recognition, gait recognition, and other unique and non-unique biometric aspects. The DAT controller 299 may further provide vehicle monitoring, and multimedia integration with driving assistances.

In one example embodiment, the DAT controller 299 may include any or all of the following modules: a sensor I/O module 305, a chassis I/O module 307, a vehicle power generation controller 310, a gait recognition module 315, an active parking assist module 320, a blind spot information system (BLIS) module 325, a trailer backup assist module 330, a lane keeping control module 335, a vehicle camera module 340, an adaptive cruise control module 345, a driver status monitoring system 350, and an augmented reality integration module 355, among other systems. It should be appreciated that the functional schematic depicted in FIG. 3 is provided as an overview of functional capabilities for the DAT controller 299. In some embodiments, the vehicle 205 may include more or fewer modules and control systems.

The DAT controller 299 can obtain input information via the sensory system(s) 282, which may include the external sensory system 381 and the internal sensory system 383 sensors disposed on the vehicle 205 interior and/or exterior, and via the chassis I/O module 307, which may be in communication with the ECUs 217. The vehicle power generation system 125 may be further configured to provide power for use by one or more of the vehicle systems shown in FIG. 3. The DAT controller 299 may receive the sensor information associated with driver functions, and environmental inputs, and other information from the sensory system(s) 282.

In other aspects, the DAT controller 299 may also be configured and/or programmed to control Level-1 and/or Level-2 driver assistance when the vehicle 205 includes Level-1 or Level-2 autonomous vehicle driving features. The DAT controller 299 may connect with and/or include a Vehicle Perception System (VPS) 281, which may include internal and external sensory systems (collectively referred to as sensory systems 282). The sensory systems 282 may be configured and/or programmed to obtain sensor data usable for biometric authentication, and for performing driver assistances operations such as, for example, active parking, trailer backup assistances, adaptive cruise control and lane keeping, driver status monitoring, and/or other features. In some aspects, the sensory systems 282 may further include the mobile device 220 functional as part of the external sensory system 381, and links personally identification information that matches power profiles, trip profiles, and other persistently-stored information with the user 240.

Figure 4:
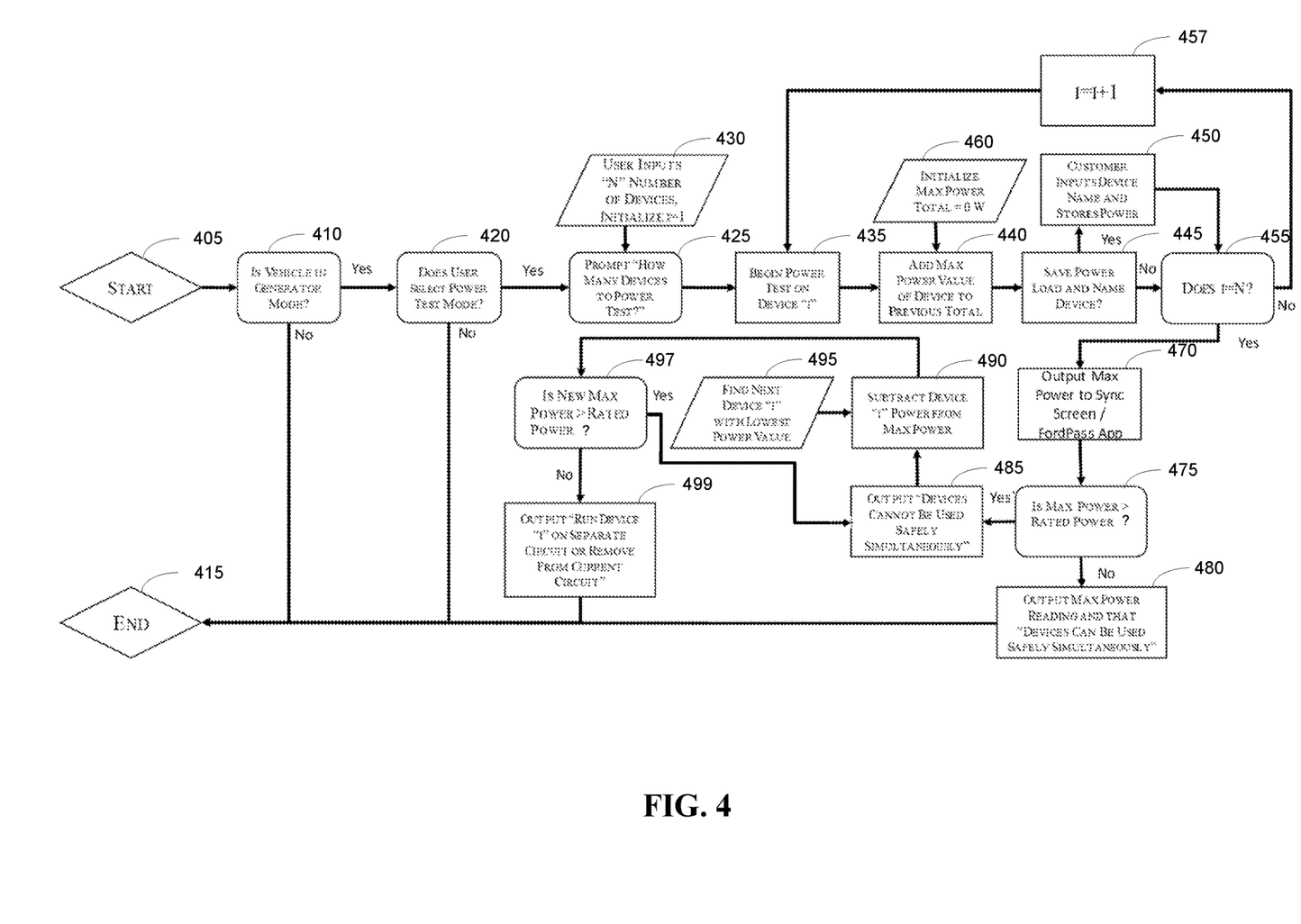
FIG. 4 illustrates a flow diagram of an example programmatic logic for testing multiple auxiliary devices powered by a vehicle in accordance with the present disclosure.

FIG. 4 illustrates a flow diagram of an example programmatic logic for testing multiple auxiliary devices powered by a vehicle in accordance with the present disclosure. As previously explained, the system 207 may be advantageous for its ease of use and understanding of the effect one or more auxiliary power devices 100 may have on the power distribution system 125 when any combination of the devices 100 are connected with the vehicle 205 and power is obtained from its power generation system.

Starting at a start step 405, the system may determine if the vehicle is in generator mode at step 410. Generator mode may be a mode where the vehicle 205 is disposed for generation of power that exceeds the power generation requirements to power the ECUs 217, while satisfying vehicle actuation and system requirements, and have sufficient power remaining to power one or more of the auxiliary devices 100. Responsive to determining that the vehicle is in power generation mode, the system 207 may determine if the user has selected a power test mode at step 420. Responsive to determining that the vehicle 205 is not in power generation mode, and/or if the user 240 has no selected a power test mode, the logic ends at step 415.

At step 425 the system may generate one or more user prompts for the user to indicate how many of the auxiliary devices 100 they wish to power. For example, the user 240 may select 1, 2, 4, 10, etc., which may be indicative of a count of the auxiliary devices to be powered. The system 207 may determine whether the user 240 has selected at least one auxiliary device for testing by determining that a number "N" of devices is greater than zero. Accordingly, at input step 430, the system 207 may initialize the power test protocols (e.g., responsive to determining that an initialization bit is enabled with a 1 value instead of a 0 value).

At step 435 the system 207 may begin the power test for device "I", where I is indicative of an $I^{th}$ device of the plurality of auxiliary devices 100.

At step 440, the system 207 may add a maximum power value of the $I^{th}$ device (not shown in FIG. 4). For example, the power test may be sequentially initiated for five devices if the user 240 has indicated that there are 5 total connected devices she/he wishes to test.

At step 460, the system may initialize the maximum power total to be 0 W at step 460, and add a maximum power value of the connected devices by observing the highest respective power draw observed while operating the respective connected auxiliary devices for a predetermined period of time (e.g., 15 seconds, 30 seconds, 2 minutes, etc.).

At step 445, the system may prompt the user to provide input for saving power load and device name information. Responsive to receiving an affirmative user input, the system 207 may save the power load information to a persistent memory (e.g., the memory 225), and prompt the user 240 to input a descriptive name to be associated with the power load information.

At step 450, the system 207 may receive a user input that includes a customer input device user name. The system 207 may update a data structure (data structure update step not shown in FIG. 4) to indicate a customer input device, user name, and power information.

At step 450, and further responsive to receiving the affirmative user input at step 445, the system 207 may generate a request for user input to indicate the count of different devices (e.g., one or more devices such as the devices 107 as illustrated in FIG. 1) that the user 240 intends to power test (e.g., step 425). The system 207 may generate a counting placeholder "I" indicative of the count of intended test devices.

Accordingly, at step 455, the system 207 may determine whether every intended/connected test device has been tested (where the value "I" is equal to zero). The system 207 may increment the value for I after completing the power test for a particular tested device at step 457, and cycle back to step 435 where the device test cycle starts again for the next device to be tested. This may be, for example, simply switching the connected device from off to on and recording the maximum power draw for the next device of the plurality of I devices.

Responsive to determining that all devices have been tested (at step 455), the system 207 may output a maximum power that was drawn to an HMI (e.g., the FordPass application or similar application) at step 470.

At step 475, the system determines a summation of maximum observed power is greater than the rated power for the power generation/distribution system 125.

When the system 207 determines that the drawn power exceeds the maximum power rating for the power generation/distribution system 125, the system 207 may output a user alert via the mobile device 220 and/or the infotainment system 210 (step 485). The system decrements the I power value from the maximum power summation, at step 490, and finds the next device of the I devices with a lower power value at step 495. This step may include, for example, identifying connected devices for which a power profile is saved in the persistent memory, and comparing respective values stored in the vehicle computer system memory.

At step 497, the system 207 determines if a new maximum power is greater than the rated power for the system 125, and at step 499 (responsive to determining that the maximum power is not greater), the system 207 may output a user instruction such as "run the device I on a separate circuit or remove the device from the current circuit." Determining that the new max power is greater than the rated power may cause the system to generate the "Devices Cannot Be Used Safely" message of step 485. The programmatic logic may end at step 415.

Returning again to step 475, where the system determines whether the maximum power for the summation of devices is greater than the rated power for the power generation/distribution system, the system may determine that the power draw while running the summation of devices is not greater than the rated system power at step 475, and output a maximum power reading using the user interface (e.g., the mobile device 220, and/or the infotainment system 210). The system 207 may output a user message indicative that output devices can be simultaneously used" at step 480. The programmatic logic may end at step 415.

FIG. 5 depicts example user interfaces 500 for auxiliary device power testing, in accordance with the present disclosure. The example user interfaces 500 include a FordPass app (e.g., the application 235 as shown in FIG. 2) providing user-selectable switch controls for pro power onboard test modes 515. For example, the user 240 may select whether they want to perform a short-term test using a control switch 520 (illustrated in FIG. 5 as active), a long-term test using a control switch 525 (shown as inactive), and/or a user-selectable switch 530 indicative of whether the user 240 wishes to collect power output data history.

By switching the control switch 530 to an affirmative setting (as shown in FIG. 5), the system 207 may retain output data (data not shown in FIG. 5) in the persistent memory 255, or in a memory associated with the server(s) 270. The output data may be, for example, a power profile that associates the device identification value(s) (e.g., a name identifier for the auxiliary device) with a power profile identifier and record associated with the respective device. For example, with reference again to FIG. 1, the power profile may identify the auxiliary device 105 as a power saw, and include power profile information such as average power consumption, maximum power consumption, and/or other power information that may indicate or change an overall aggregate power consumption limitation.

The interface example 535 depicts one embodiment of the power profile information, which may include information such as time information, date information, and information indicative of whether the user 240 is on or off-target with respect to a power consumption plan set by the user 240.

In one aspect, the power plan profile may be created by the user while using the application 235 on the mobile device 220 or a computing device (not shown) associated with the vehicle 205 and/or another computer. The application 235 may further include one or more user-interactive controls such a s a power plan slider 535, which may indicate a maximum aggregated power the user 240 plans to use on the present date or block of time extending to several days, such as during a trip or excursion. This feature may be important for predicting future use according to a power profile, and create a user-friendly utility that provides useful information that assists the user 240 to 1) determine which devices that are wanted to be powered by the vehicle 205 may be run simultaneously, and 2) predict an overall volume of power consumption that the user 240 intends to use during the planned trip or excursion. The application 235 may further assist the user to economize the use of power during the trip or time span with a target power consumption budget, which may provide daily consumption targets that are user-selectable and trackable.

For example, in some aspects, the application shown in FIG. 5 may further include a trip profile having a persistent record of the particular auxiliary devices that were previously tested that may be used during a set time span. In one example embodiment, the user 240 may wish to go camping a remote area having no available power connections exterior to the vehicle 205. Accordingly, the user 240 may wish to use the application 207 to monitor and budget their power use according to the usage target, to ensure there is sufficient power reserved for the trip home or other planned uses.

Figure 6:
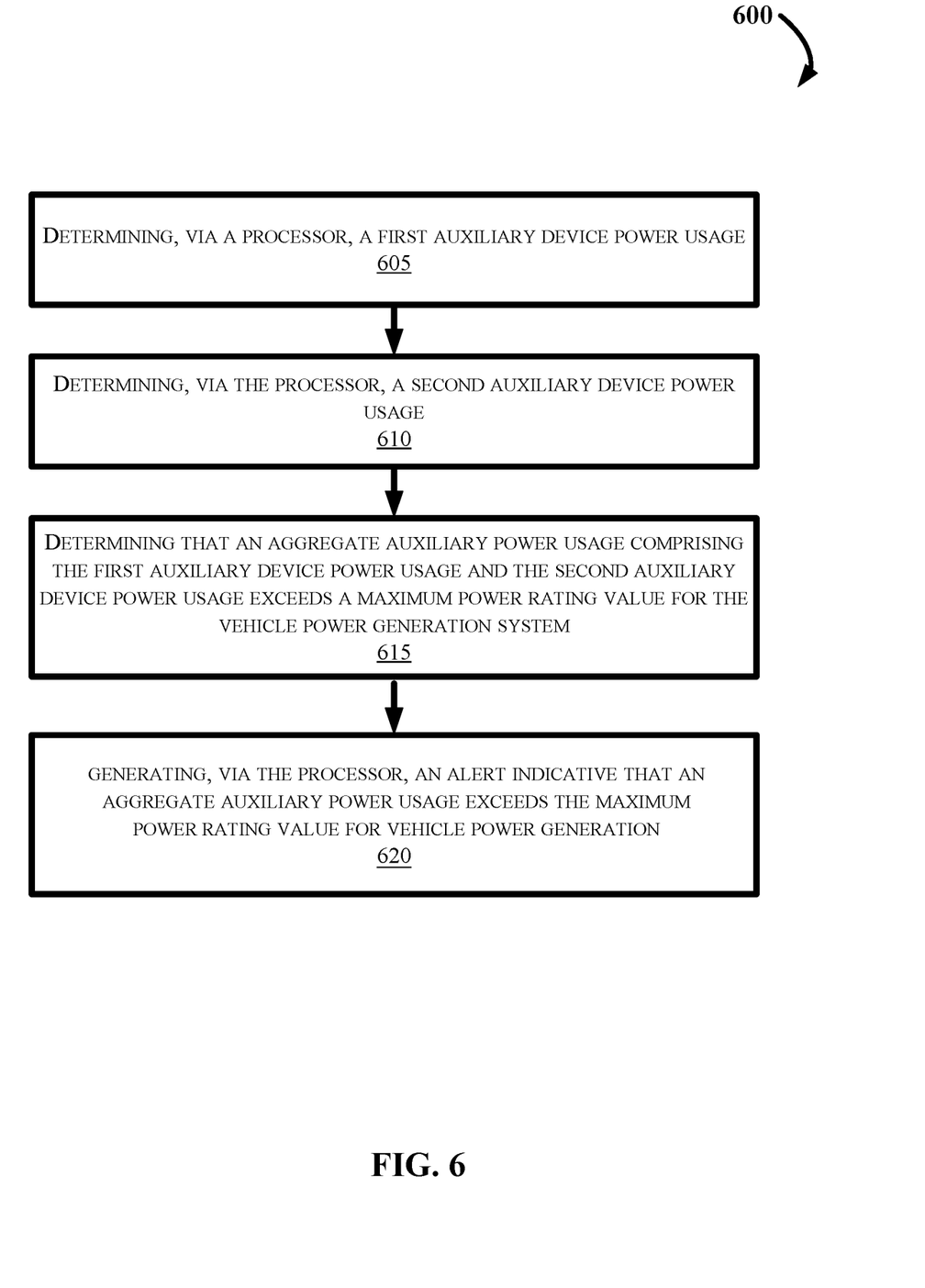
FIG. 6 depicts a flow diagram of an example method for controlling a vehicle power generation system in accordance with the present disclosure.

FIG. 6 is a flow diagram of an example method 600 for controlling a vehicle power generation system, according to the present disclosure. FIG. 6 may be described with continued reference to prior figures, including FIGS. 1-5. The following process is exemplary and not confined to the steps described hereafter. Moreover, alternative embodiments may include more or less steps that are shown or described herein, and may include these steps in a different order than the order described in the following example embodiments.

Referring first to FIG. 6, at step 605, the method 600 may commence with determining, via a processor, a first auxiliary device power usage.

At step 610, the method 600 may further include determining, via the processor, a second auxiliary device power usage. This step may include determining a time estimate for the first auxiliary device power usage and the second auxiliary device power usage during the trip. In such an embodiment, the trip profile comprises information indicative of a total power usage.

At step 615, the method 600 may further include determining that an aggregate auxiliary power usage comprising the first auxiliary device power usage and the second auxiliary device power usage exceeds a maximum power rating value for the vehicle power generation system. This step may include determining individual device power usages using a real-time test procedure where the device and/or devices are attached to the power distribution system, operating the device and/or devices, and/or determining aggregated power usages (which would normally be theoretical aggregates, as the testing procedures may be best done with individual use of the auxiliary devices one at a time) by power consumption measurement.

At step 620, the method 600 may further include generating, via the processor, an alert indicative that an aggregate auxiliary power usage exceeds the maximum power rating value for vehicle power generation. This step may include generating, via the processor, a power trace record associated with power consumption for the first auxiliary device power usage and the second auxiliary device power usage. In some aspects, the power trace record may include one or more power usage profiles that have populated power use information associated with the auxiliary device at issue, during a duration of time, while the device is in use and connected to the vehicle power generation system. Accordingly, the system may project, via the processor, an aggregate power usage prediction based on a trip profile, and predict an amount of power to be used on a trip. In one example, the prediction can be based on a trip duration in time and a power usage prediction associated with the first auxiliary device and the second auxiliary device (e.g., the Ith device, and the I−1 device), and explained in FIG. 5).

In the above disclosure, reference has been made to the accompanying drawings, which form a part hereof, which illustrate specific implementations in which the present disclosure may be practiced. It is understood that other implementations may be utilized, and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a feature, structure, or characteristic is described in connection with an embodiment, one skilled in the art will recognize such feature, structure, or characteristic in connection with other embodiments whether or not explicitly described.

Further, where appropriate, the functions described herein can be performed in one or more of hardware, software, firmware, digital components, or analog components. For example, one or more application specific integrated circuits (ASICs) can be programmed to carry out one or more of the systems and procedures described herein. Certain terms are used throughout the description and claims refer to particular system components. As one skilled in the art will appreciate, components may be referred to by different names. This document does not intend to distinguish between components that differ in name, but not function.

It should also be understood that the word "example" as used herein is intended to be non-exclusionary and non-limiting in nature. More particularly, the word "example" as used herein indicates one among several examples, and it should be understood that no undue emphasis or preference is being directed to the particular example being described.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Computing devices may include computer-executable instructions, where the instructions may be executable by one or more computing devices such as those listed above and stored on a computer-readable medium.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating various embodiments and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary. Conditional language, such as, among others, "can," "could," "might," or "may," unless specifically stated otherwise, or otherwise understood within the context as used, is generally intended to convey that certain embodiments could include, while other embodiments may not include, certain features, elements, and/or steps. Thus, such conditional language is not generally intended to imply that features, elements, and/or steps are in any way required for one or more embodiments.

That which is claimed is:

1. A method for controlling a vehicle power generation system, comprising:
    receiving, by a vehicle, an indication to perform an auxiliary power test;
    measuring, via a processor and at a first time, a first auxiliary device power usage of a first auxiliary device;
    measuring, via the processor and at a second time, a second auxiliary device power usage of a second auxiliary device;
    predicting that the first auxiliary device and the second auxiliary device are to be connected to the vehicle simultaneously for a future period of time;
    predicting an aggregate auxiliary power usage to be used by the first auxiliary device and the second auxiliary device during the future period of time;
    predicting that the aggregate auxiliary power usage comprising the first auxiliary device power usage and the second auxiliary device power usage exceeds a maximum power rating value for the vehicle power generation system; and
    generating, via the processor, an alert indicative that the aggregate auxiliary power usage will exceed the maximum power rating value for the vehicle power generation system for the future period of time.

2. The method according to claim 1, further comprising:
    generating, via the processor, a power trace record associated with the first auxiliary device power usage and the second auxiliary device power usage, wherein the power trace record comprises a power usage profile during a duration of time while the first auxiliary device is in use and connected to the vehicle power generation system.

3. The method according to claim 1, further comprising:
    projecting, via the processor, an aggregate power usage prediction based on a trip profile.

4. The method according to claim 3, further comprising determining a first time estimate for the first auxiliary device power usage and a second time estimate for the second auxiliary device power usage during the future period of time.

5. The method according to claim 4, wherein the trip profile comprises information indicative of a total power usage of the first auxiliary device and the second auxiliary device.

6. A vehicle power generation testing system, comprising:
    a processor; and
    a memory for storing executable instructions, the processor programmed to execute the instructions to:
    receive, by a vehicle, an indication to perform an auxiliary power test;
    measure, at a first time, a first auxiliary device power usage of a first auxiliary device;
    measure, at a second time, a second auxiliary device power usage of a second auxiliary device;
    predict that the first auxiliary device and the second auxiliary device are to be connected to the vehicle simultaneously for a future period of time;
    predict an aggregate auxiliary power usage to be used by the first auxiliary device and the second auxiliary device during the future period of time;
    predict that the aggregate auxiliary power usage comprising the first auxiliary device power usage and the second auxiliary device power usage exceeds a maximum power rating value for a vehicle power generation system; and
    generate an alert indicative that the aggregate auxiliary power usage will exceed the maximum power rating value for the vehicle power generation system for the future period of time.

7. The system according to claim 6, wherein the processor is further programmed to execute the instructions to:

generate a power trace record associated with the first auxiliary device power usage and the second auxiliary device power usage.

8. The system according to claim 7, wherein the power trace record comprises a power usage profile during a duration of time while the first auxiliary device is in use and connected to the vehicle power generation system.

9. The system according to claim 8, wherein the processor is further programmed to execute the instructions to:
project aggregate power usage prediction based on the power usage profile.

10. The system according to claim 9, wherein the processor is further programmed to execute the instructions to:
predict an aggregate power usage prediction based on a trip scheduled for a duration in time, and a power usage prediction associated with the first auxiliary device and the second auxiliary device.

11. The system according to claim 10, wherein the processor is further programmed to execute the instructions to:
generate a first time estimate for the first auxiliary device power usage and a second time estimate for the second auxiliary device power usage.

12. The system according to claim 11, wherein the processor is further programmed to execute the instructions to:
determine a first time estimate for the first auxiliary device power usage and a second time estimate for the second auxiliary device power usage during the trip.

13. A non-transitory computer-readable storage medium in an electric vehicle power distribution controller of a vehicle, the computer-readable storage medium having instructions stored thereupon which, when executed by a processor, cause the processor to:
receive, by the vehicle, an indication to perform an auxiliary power test;
measure, at a first time, a first auxiliary device power usage of a first auxiliary device;
measure, at a second time, a second auxiliary device power usage of a second auxiliary device;
predict that the first auxiliary device and the second auxiliary device are to be connected to the vehicle simultaneously for a future period of time;
predict an aggregate auxiliary power usage to be used by the first auxiliary device and the second auxiliary device during the future period of time;
predict that the aggregate auxiliary power usage comprising the first auxiliary device power usage and the second auxiliary device power usage exceeds a maximum power rating value for a vehicle power generation system; and
generate an alert indicative that the aggregate auxiliary power usage will exceed the maximum power rating value for the vehicle power generation system for the future period of time.

14. The non-transitory computer-readable storage medium according to claim 13, having further instructions stored thereupon to:
generate a power trace record associated with the first auxiliary device power usage and the second auxiliary device power usage.

15. The non-transitory computer-readable storage medium according to claim 14, wherein the power trace record comprises a power usage profile during a duration of time while the first auxiliary device is in use and connected to the vehicle power generation system.

16. The non-transitory computer-readable storage medium according to claim 15, having further instructions stored thereupon to:
predict an amount of power to be used on a trip, aggregate power usage prediction based on a trip duration in time, and a power usage prediction associated with the first auxiliary device and the second auxiliary device.

17. The non-transitory computer-readable storage medium according to claim 16, having further instructions stored thereupon to:
generate a first time estimate for the first auxiliary device power usage and a second time estimate for the second auxiliary device power usage.

18. The non-transitory computer-readable storage medium according to claim 17, having further instructions stored thereupon to:
determine a first time estimate for the first auxiliary device power usage and a second time estimate for the second auxiliary device power usage during the trip.

* * * * *